US012387969B2

(12) United States Patent
Yamazaki et al.

(10) Patent No.: US 12,387,969 B2
(45) Date of Patent: Aug. 12, 2025

(54) SUBSTRATE PROCESSING APPARATUS, SUBSTRATE HOLDING APPARATUS, AND METHOD OF MANUFACTURING SEMICONDUCTOR DEVICE

(71) Applicant: Kokusai Electric Corporation, Tokyo (JP)

(72) Inventors: Keishin Yamazaki, Toyama (JP); Norichika Yamagishi, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 652 days.

(21) Appl. No.: 17/586,202

(22) Filed: Jan. 27, 2022

(65) Prior Publication Data
US 2022/0246463 A1    Aug. 4, 2022

(30) Foreign Application Priority Data
Feb. 2, 2021    (JP) .................................. 2021-015035

(51) Int. Cl.
H01L 21/687    (2006.01)
H01L 21/67    (2006.01)
H01L 21/677    (2006.01)

(52) U.S. Cl.
CPC .. *H01L 21/68764* (2013.01); *H01L 21/67115* (2013.01); *H01L 21/67748* (2013.01); *H01L 21/67754* (2013.01); *H01L 21/67778* (2013.01); *H01L 21/68707* (2013.01)

(58) Field of Classification Search
CPC ......... H01L 21/68764; H01L 21/67748; H01L 21/67754; H01L 21/67778; H01L 21/68707; H01L 21/6719; H01L 21/67766; H01L 21/68792; H01L 21/67115
See application file for complete search history.

(56) References Cited

U.S. PATENT DOCUMENTS

| 6,837,940 B2 | 1/2005 | Komeno et al. |
| 2014/0367377 A1* | 12/2014 | Monden ............ H01L 21/68742 219/747 |
| 2016/0122872 A1* | 5/2016 | Kato ................. H01L 21/68764 118/712 |
| 2019/0295873 A1 | 9/2019 | Hirochi |

(Continued)

FOREIGN PATENT DOCUMENTS

| JP | 2003-188241 A | 7/2003 |
| JP | 2004-296639 A | 10/2004 |
| JP | 2007-035775 A | 2/2007 |

(Continued)

OTHER PUBLICATIONS

Korean Office Action issued on Dec. 7, 2023 for Korean Patent Application No. 10-2022-0012018.

(Continued)

*Primary Examiner* — Latanya N Crawford Eason
(74) *Attorney, Agent, or Firm* — Volpe Koenig

(57) ABSTRACT

There is provided a technique that includes a process chamber configured to process at least one substrate; a microwave generator configured to generate a microwave; a substrate holder configured to load and hold the at least one substrate; and a rotator which includes an output shaft configured to support the substrate holder and an input shaft installed at an off-centered position with respect to the output shaft.

13 Claims, 11 Drawing Sheets

(56) References Cited

U.S. PATENT DOCUMENTS

2020/0194287 A1    6/2020   Hirochi et al.

FOREIGN PATENT DOCUMENTS

| JP | 4537566 B2 | 9/2010 |
| JP | 5636996 B2 | 12/2014 |
| JP | 2019-169509 A | 10/2019 |
| KR | 10-2020-0026306 A | 3/2020 |
| WO | 2017/149663 A1 | 9/2017 |

OTHER PUBLICATIONS

Japanese Office Action issued on Aug. 23, 2022 for Japanese Patent Application No. 2021-015035.

\* cited by examiner

SUBSTRATE PROCESSING APPARATUS, SUBSTRATE HOLDING APPARATUS, AND METHOD OF MANUFACTURING SEMICONDUCTOR DEVICE

CROSS-REFERENCE TO RELATED APPLICATION

This application is based upon and claims the benefit of priority from Japanese Patent Application No. 2021-015035, filed on Feb. 2, 2021, the entire contents of which are incorporated herein by reference.

TECHNICAL FIELD

The present disclosure relates to a substrate processing apparatus, a substrate holding apparatus, and a method of manufacturing a semiconductor device.

BACKGROUND

As one process of manufacturing a semiconductor device, there is known, for example, a modifying process, which is represented by an annealing process of modifying a composition of a crystal structure of a thin film formed on a surface of a substrate or restoring a crystal defect or the like in a formed thin film by heating the substrate in a process chamber using a heater. In recent years, semiconductor devices have become remarkably miniaturized and highly integrated. Along with this, there is a demand for a modifying process on a high-density substrate in which a pattern having a high aspect ratio is formed. As a method for the modifying process on such a high-density substrate, for example, a heat treatment method using an electromagnetic wave has been studied.

SUMMARY

A rotation axis of a boat rotator and a rotation axis of the wafer are on the same straight line. In induction heating of radiating an electromagnetic wave to a wafer, there is a possibility that a thick portion and a thin portion appear in a circumferential direction due to an influence of a standing wave corresponding to a wavelength and a frequency of the electromagnetic wave, which makes the film thickness uniformity deteriorate.

Some embodiments of the present disclosure provide a technique capable of improving a film thickness uniformity.

According to some embodiments of the present disclosure, there is provided a technique that includes a process chamber configured to process at least one substrate; a microwave generator configured to generate a microwave; a substrate holder configured to load and hold of the at least one substrate; and a rotator which includes an output shaft configured to support the substrate holder and an input shaft installed at an off-centered position with respect to the output shaft.

BRIEF DESCRIPTION OF DRAWINGS

The accompanying drawings, which are incorporated in and constitute a part of the specification, illustrate embodiments of the present disclosure.

DETAILED DESCRIPTION

Figure 1:
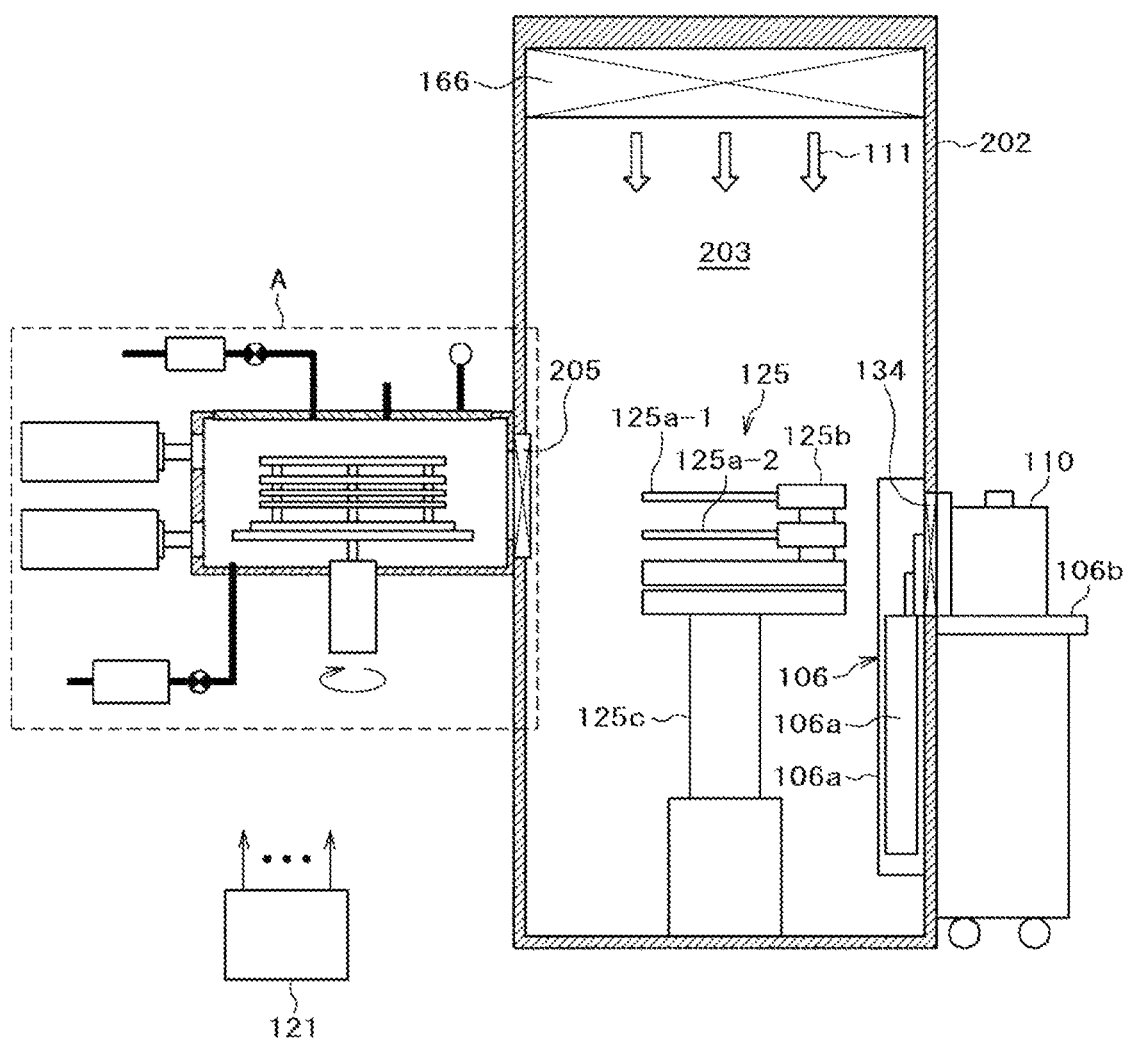
FIG. 1 is a vertical cross-sectional view in which a schematic configuration of a substrate processing apparatus suitably used in some embodiments of the present disclosure is shown at a position of a process furnace.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, some embodiments of the present disclosure will be described with reference to FIGS. 1 to 12. Throughout the drawings, the same or corresponding configurations are designated by the same or corresponding reference numerals, and the duplicate description thereof is omitted. The drawings used in the following description are all schematic. The dimensional relationship of each element on the drawings, the ratio of each element, and the like do not always match the actual ones. Further, even between the drawings, the dimensional relationship of each element, the ratio of each element, and the like do not always match.

(1) Configuration of Substrate Processing Apparatus

The substrate processing apparatus 100 according to embodiments is configured as a single-substrate heat treatment apparatus that performs various heat treatments on one wafer or a plurality of wafers. The substrate processing apparatus 100 will be described as an apparatus that performs an annealing process (modifying process) using an electromagnetic wave described later. In the substrate processing apparatus 100 of the present embodiments, a FOUP (Front Opening Unified Pod hereinafter referred to as a pod) 110 is used as a storage container (carrier) in which wafers 200 as substrates are accommodated. The pod 110 is also used as a transfer container for transferring the wafers 200 between various substrate processing apparatuses.

Figure 2:
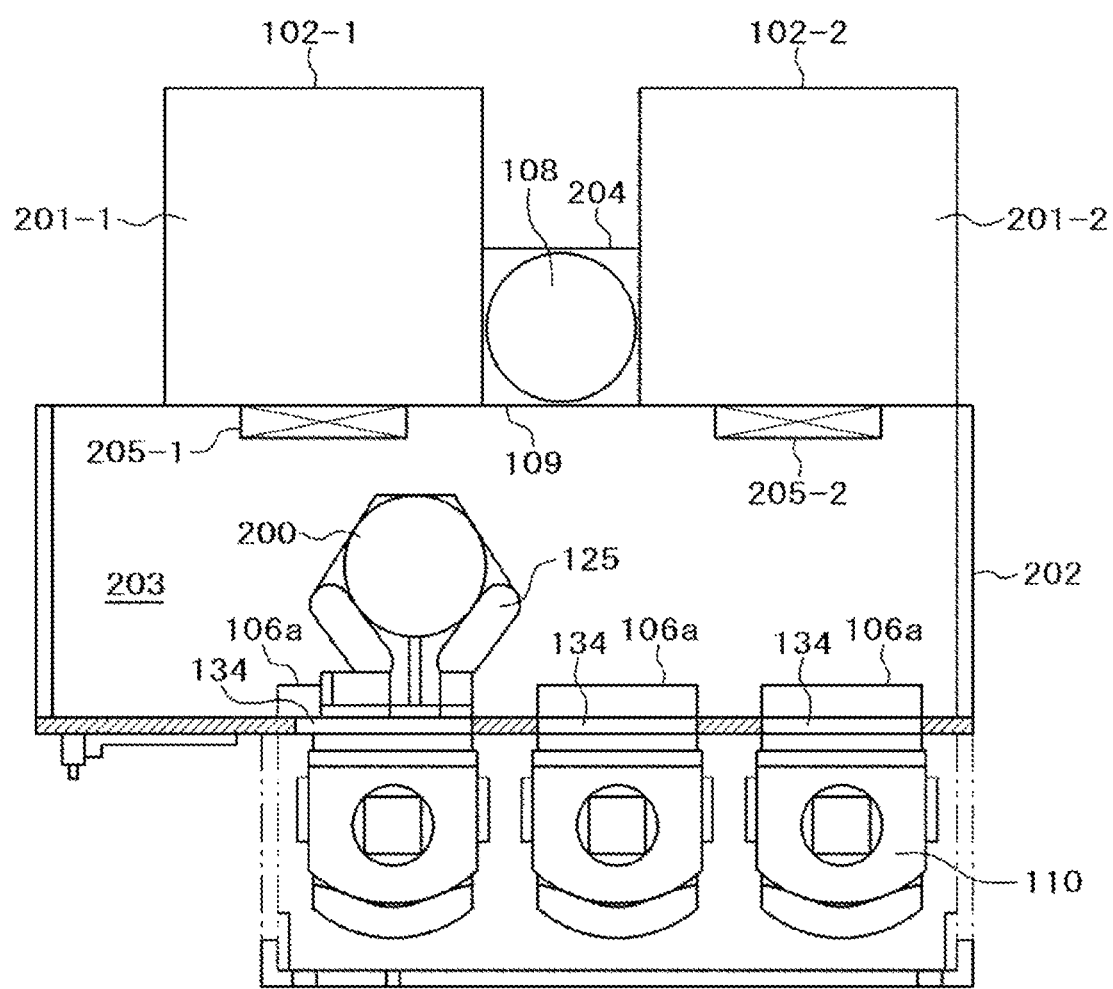
FIG. 2 is a cross-sectional view showing a schematic configuration of a substrate processing apparatus suitably used in some embodiments of the present disclosure.

As shown in FIGS. 1 and 2, the substrate processing apparatus 100 includes a transfer housing 202 having a transfer chamber 203 for transferring the wafers 200 therein and cases 102-1 and 102-2 installed on a side wall of the transfer housing 202 and having process chambers 201-1 and 201-2 for processing the wafers 200 therein as process containers to be described. Further, a cooling case 109 that forms a cooling chamber 204, which will be described later, is installed between the process chambers 201-1 and 201-2.

A load port unit (LP) 106, as a pod opening/closing mechanism, for opening and closing a lid of the pod 110 and loading and unloading the wafer 200 into and out of the transfer chamber 203 is arranged on a right side in FIG. 1 (a lower side in FIG. 2), which is a front side of the transfer housing 202. The load port unit 106 includes a housing 106a, a stage 106b, and an opener 106c. The stage 106b is configured to mount the pod 110 thereon and bring the pod 110 close to a substrate loading/unloading port 134 formed on a front side of the housing of the transfer chamber 203. The opener 106c is configured to open and close a lid (not shown) installed in the pod 110. Further, the load port unit 106 may have a function capable of purging an inside of the pod 110 with a purge gas such as an $N_2$ gas or the like. In addition, the transfer housing 202 has a purge gas circulation structure, which will be described later, for circulating a purge gas such as an $N_2$ gas or the like in the transfer chamber 203.

Gate valves (GV) 205-1 and 205-2, which are configured to open and close the process chambers 201-1 and 201-2, are arranged on a left side in FIG. 1 (an upper side in FIG. 2), which is a rear side of the transfer housing 202. In the transfer chamber 203, a substrate transfer robot as a substrate transfer mechanism for transferring the wafer 200 and a transfer machine 125 as a substrate transfer part are installed. The transfer machine 125 includes tweezers (arms) 125a-1 and 125a-2 as mounting parts on which the wafer 200 is mounted, a transfer device 125b capable of horizontally rotating or linearly moving each of the tweezers 125a-1 and 125a-2, and a transfer device elevator 125c which moves up and down the transfer device 125b. By a continuous operation of the tweezers 125a-1 and 125a-2, the transfer device 125b, and the transfer device elevator 125c, the wafer 200 can be charged into and discharged from a boat (substrate holder) 217, the cooling chamber 204, or the pod 110. Hereinafter, the cases 102-1 and 102-2, the process chambers 201-1 and 201-2, and the tweezers 125a-1 and 125a-2 will be simply referred to as the case 102, the process chamber 201, and the tweezers 125a unless it is not needed to distinguish them in the description thereof.

The tweezer 125a-1 is made of an ordinary aluminum material and is used for transferring a wafer of a low temperature or a room temperature. The tweezer 125a-2 is made of a material such as aluminum or quartz having high heat resistance and poor thermal conductivity and is used for transferring a wafer of a high temperature or a room temperature. That is, the tweezer 125a-1 is a substrate transfer part for a low temperature, and the tweezer 125a-2 is a substrate transfer part for a high temperature. The tweezer 125a-2 for high temperature may be configured to have heat resistance at, for example, 100 degrees C. or higher, more desirably 200 degrees C. or higher. A mapping sensor may be installed on the tweezer 125a-1 for low temperature. By installing the mapping sensor on the tweeters 125a-1 for low temperature, it is possible to confirm the number of wafers 200 in the load port unit 106, the number of wafers 200 in the process chamber 201, and the number of wafers 200 in the cooling chamber 204.

In some embodiments, the tweezer 125a-1 is described as the tweezer for low temperature, and the tweezer 125a-2 is described as the tweezer for high temperature. However, the present disclosure is not limited thereto. The tweezer 125a-1 may be made of a material such as aluminum or quartz having high heat resistance and poor thermal conductivity and may be used for transferring a wafer having a high temperature or a room temperature. The tweezers 125a-2 may be made of aluminum and used for transferring a wafer having a low temperature or a room temperature. Further, both the tweezers 125a-1 and 125a-2 may be made of a material such as aluminum or a quartz member having high heat resistance and poor thermal conductivity.

(Process Furnace)

Figure 3:
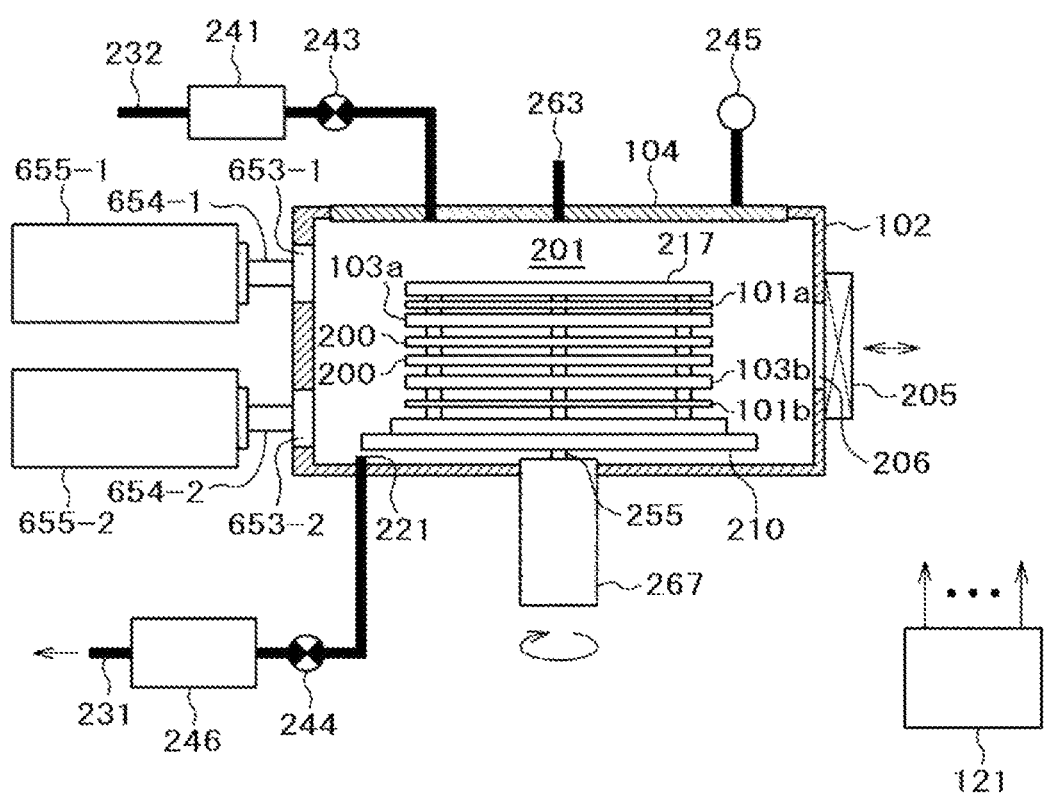
FIG. 3 is a schematic configuration diagram in which a process furnace portion of a substrate processing apparatus suitably used in some embodiments of the present disclosure is shown in a vertical cross-sectional view.

In region A surrounded by a broken line in FIG. 1, there is installed a process furnace having a substrate processing structure as shown in FIG. 3. As shown in FIG. 2, a plurality of process furnaces is installed in the present embodiments. Since configurations of the process furnaces are the same, one process furnace configuration will be described, and the descriptions of the other process furnace configuration will be omitted.

As shown in FIG. 3, the process furnace includes a case 102 as a cavity (process container) made of a material such as a metal or the like that reflects an electromagnetic wave. Further, a cap flange (closing plate) 104, which is made of a metallic material, is configured to close an upper end of the case 102 via an O-ring as a sealing member (not shown). Inner spaces of the case 102 and the cap flange 104 are mainly configured as a process chamber 201 for processing a substrate such as a silicon wafer or the like. A reaction tube (not shown) made of quartz through which an electromagnetic wave transmits, may be installed inside the case 102. Also, the process container may be configured such that an interior of the reaction tube serves as a process chamber. Further, the process chamber 201 may be configured by a case 102 having a closed ceiling without installing the cap flange 104.

A mounting table 210 is installed in the process chamber 201, and a boat 217, which is a substrate holder that is configured to load and hold a plurality of wafers 200 as substrates, is mounted on the upper surface of the mounting table 210. In the boat 217, the wafers 200 to be processed and susceptors 103a and 103b placed in a vertical direction of the wafers 200 so as to interpose the wafers 200 therebetween are held at predetermined intervals. The susceptors 103a and 103b are configured by silicon plates (Si plates) made of, for example, polycrystalline silicon of a columnar crystal structure solidified in a vertical direction (a direction perpendicular to the wafers 200) and having isotropic thermal conductivity without a crystal orientation. The susceptors 103*a* and 103*b* are arranged above and below the wafers 200 to suppress concentration of electric field strength on the edges of the wafers 200. That is, the susceptors 103*a* and 103*b* are to suppress absorption of an electromagnetic wave for the edges of the wafers 200. Further, since a heat generation amount in the susceptors 103*a* and 103*b* is larger than a heat generation amount in the wafers 200, heating elements are arranged above and below the wafers 200. Thus, a heat retention property (heat insulating property) becomes large, and variation in a temperature inside the wafers becomes small. Further, quartz plates 101*a* and 101*b* as heat insulating plates may be held on the upper and lower surfaces of the susceptors 103*a* and 103*b* at predetermined intervals. In this specification, the quartz plates 101*a* and 101*b* and the susceptors 103*a* and 103*b* are respectively made of the same components and will be referred to as a quartz plate 101 and a susceptor 103 below unless there is a need to explain them separately.

The case 102 as a process container has, for example, a circular cross section and is configured as a flat closed container. Further, the transfer housing 202 as a lower container is made of, for example, a metallic material such as aluminum (Al) or stainless steel (SUS), quartz, or the like. A space surrounded by the case 102 may be referred to as a process chamber 201 or a reaction area 201 as a process space, and a space surrounded by the transfer housing 202 may be referred to as a transfer chamber or a transfer area 203 as a transfer space. It may not be limited that the process chamber 201 and the transfer chamber 203 are configured to be adjacent to each other in a horizontal direction as in the present embodiments but they may be configured to be adjacent to each other in a vertical direction to move up and down a substrate holder having a predetermined structure.

As shown in FIGS. 1, 2 and 3, a substrate loading/unloading port 206 adjacent to a gate valve 205 is installed on a side surface of the transfer housing 202, and the wafer 200 is moved between the process chamber 201 and the transfer chamber 203 through the substrate loading/unloading port 206. A choke structure having a length of ¼ wavelength of an electromagnetic wave in use is installed around the gate valve 205 or the substrate loading/unloading port 206, as a measure against leakage of an electromagnetic wave to be described later.

An electromagnetic wave supplier as a heater described in detail later is installed on a side surface of the case 102. An electromagnetic wave such as a microwave or the like supplied from the electromagnetic wave supplier is introduced into the process chamber 201 to heat the wafers 200 and the like, thereby processing the wafers 200.

The mounting table 210 is supported by a shaft 255 as a rotating shaft. The shaft 255 is connected to a drive mechanism 267 as a rotator that performs a rotation operation at the bottom and outside of the process chamber 201. By operating the drive mechanism 267 to rotate the shaft 255 and the mounting table 210, it is possible to rotate the wafers 200 mounted on the boat 217. The details of the drive mechanism 267 will be described later.

In this regard, the mounting table 210 may be configured to move up and down by the drive mechanism 267 such that the wafer 200 is located at a wafer transfer position in conformity with a height of the substrate loading/unloading port 206 at the time of transferring the wafer 200, and may be configured to move up and down by the drive mechanism 267 to a processing position (wafer processing position) in the process chamber 201.

An exhauster, which is configured to exhaust an atmosphere in the process chamber 201, is installed below the process chamber 201 and at an outer peripheral side of the mounting table 210. As shown in FIG. 3, an exhaust port 221 is installed in the exhauster. An exhaust pipe 231 is connected to the exhaust port 221. A pressure regulator 244 such as an APC valve or the like, which controls a valve opening degree according to a pressure in the process chamber 201, and a vacuum pump 246 are sequentially connected to the exhaust pipe 231 in series.

In this regard, the pressure regulator 244 is not limited to the APC valve as long as an exhaust amount can be adjusted by receiving pressure information in the process chamber 201 and a feedback signal from a pressure sensor 245 to be described later. A typical opening/closing valve and a pressure regulation valve may be used together.

An exhauster (also referred to as an exhaust system or an exhaust line) is mainly composed of the exhaust port 221, the exhaust pipe 231, and the pressure regulator 244. Exhaust ports may be installed to surround the mounting table 210 so as to be capable of exhaust a gas from the entire circumference of the wafer 200. Further, the vacuum pump 246 may be added to the configuration of the exhauster.

In the cap flange 104, there is installed a gas supply pipe 232 configured to supply processing gases such as an inert gas, a precursor gas, and a reaction gas for various substrate processing processes into the process chamber 201. In the gas supply pipe 232, a mass flow controller (MFC) 241, which is a flow rate controller (flow rate control part), and a valve 243, which is an opening/closing valve, are installed sequentially from an upstream side thereof. For example, a nitrogen ($N_2$) gas source, which is an inert gas source, is connected to an upstream side of the gas supply pipe 232 and is configured to supply a $N_2$ gas into the process chamber 201 via the MFC 241 and the valve 243. When using different gases for substrate processing, the different gases can be supplied by using a configuration in which a gas supply pipe provided with an MFC, which is a flow rate controller, and a valve, which is an opening/closing valve, sequentially from the upstream side thereof is connected to the gas supply pipe 232 on a downstream side of the valve 243. A gas supply pipe provided with an MFC and a valve may be installed for each gas type.

A gas supply system (gas supplier) is mainly composed of the gas supply pipe 232, the MFC 241, and the valve 243. When an inert gas is allowed to flow in the gas supply system, the gas supply system is also referred to as an inert gas supply system. As the inert gas, in addition to the $N_2$ gas, it may be possible to use, for example, a rare gas such as an Ar gas, a He gas, a Ne gas, a Xe gas, or the like.

A temperature sensor 263 as a non-contact-type temperature measurement device is installed on the cap flange 104. By adjusting an output of a below-described microwave oscillator (microwave generator) 655 based on temperature information detected by the temperature sensor 263, the substrate is heated so that the substrate temperature has a desired temperature distribution. The temperature sensor 263 is composed of a radiation thermometer such as an IR (Infrared Radiation) sensor or the like. The temperature sensor 263 is installed so as to measure a surface temperature of the quartz plate 101*a* or a surface temperature of the wafer 200. When the susceptor as the heating element described above is installed, the temperature sensor 263 may be configured to measure a surface temperature of the susceptor. The temperature of the wafer 200 (wafer temperature) described in the present embodiments refers to a wafer temperature converted by temperature conversion data to be described later, that is, an estimated wafer temperature, a temperature obtained by directly measuring a temperature of the wafer 200 with the temperature sensor 263, or both.

By acquiring a transition of a temperature change for each of the quartz plate 101 or the susceptor 103 and the wafer 200 in advance by the temperature sensor 263, the temperature conversion data indicative of correlation between a temperature of the quartz plate 101 or the susceptor 103 and a temperature of the wafer 200 may be stored in the memory device 121c or the external memory device 123. By creating the temperature conversion data in advance in this way, the temperature of the wafer 200 can be estimated by measuring the temperature of the quartz plate 101 alone. The output of the microwave oscillator 655, that is, the heater can be controlled based on the estimated temperature of the wafer 200.

The temperature sensor is not limited to the radiation thermometer described above. The temperature may be measured by a thermocouple, or the temperature may be measured by using a thermocouple and a non-contact-type thermometer in combination. However, when the temperature is measured by the thermocouple, it is needed to arrange the thermocouple in the vicinity of the wafer 200 to measure the temperature. That is, since it is needed to arrange the thermocouple in the process chamber 201, the thermocouple itself may be heated by the microwave supplied from a microwave oscillator described later, which makes it difficult to accurately measure the temperature. Therefore, it is desirable to use a non-contact-type thermometer as the temperature sensor 263.

Further, the temperature sensor 263 is not limited to being installed on the cap flange 104 but may be installed on the mounting table 210. Further, the temperature sensor 263 may not be directly installed on the cap flange 104 or the mounting table 210 but may be configured to indirectly measure the temperature by reflecting the radiation light from a measurement window installed on the cap flange 104 or the mounting table 210 with a mirror or the like. Further, the temperature sensor 263 is not limited to one. A plurality of temperature sensors 263 may be installed.

Electromagnetic wave introduction ports 653-1 and 653-2 are installed on a side wall of the case 102. One ends of waveguides 654-1 and 654-2 for supplying electromagnetic waves (microwaves) into the process chamber 201 are connected to the electromagnetic wave introduction ports 653-1 and 653-2, respectively. Microwave oscillators (electromagnetic wave sources) 655-1 and 655-2 as heating sources for heating by supplying electromagnetic waves into the process chamber 201 are connected to the other ends of the waveguides 654-1 and 654-2, respectively. The microwave oscillators 655-1 and 655-2 supply electromagnetic waves such as microwaves or the like to the waveguides 654-1 and 654-2, respectively. Further, as the microwave oscillators 655-1 and 655-2, magnetrons, klystrons, and the like are used. Hereinafter, the electromagnetic wave introduction ports 653-1 and 653-2, the waveguides 654-1 and 654-2, and the microwave oscillators 655-1 and 655-2 will be described as an electromagnetic wave introduction port 653, a waveguide 654, and a microwave oscillator 655 unless there is a need to distinguish them from each other.

A frequency of the electromagnetic wave generated by the microwave oscillator 655 is controlled to fall in the frequency range of, desirably, 13.56 MHz or more and 24.125 GHz or less. More desirably, the frequency of the electromagnetic wave is controlled to be a frequency of 2.45 GHz or 5.8 GHz. In this regard, the frequencies of the microwave oscillators 655-1 and 655-2 may be set to be the same or different.

Further, in the present embodiments, two microwave oscillators 655 are arranged on the side surface of the case 102. However, the present disclosure is not limited thereto. One or more microwave oscillators may be installed and may be arranged on different side surfaces such as opposite side surfaces of the case 102. An electromagnetic wave supplier (also referred to as an electromagnetic wave supply device, a microwave supplier or a microwave supply device) as a heater is mainly composed of the microwave oscillators 655-1 and 655-2, the waveguides 654-1 and 654-2 and the electromagnetic wave introduction ports 653-1 and 653-2.

A controller 121, which will be described later, is connected to each of the microwave oscillators 655-1 and 655-2. The temperature sensor 263 for measuring the temperature of the quartz plate 101a or 101b or the wafer 200 accommodated in the process chamber 201 is connected to the controller 121. The temperature sensor 263 measures the temperature of the quartz plate 101 or the wafer 200 by a below-described method and transmits the measured temperature to the controller 121. The controller 121 controls the outputs of the microwave oscillators 655-1 and 655-2 to control the heating of the wafer 200. As the method of controlling the heating performed by the heater, it may be possible to use a method of controlling the heating of the wafer 200 by controlling a voltage inputted to the microwave oscillator 655, a method of controlling the heating of the wafer 200 by changing a ratio of the on-time of the power source of the microwave oscillator 655 and the off-time of the power source thereof, and the like.

The microwave oscillators 655-1 and 655-2 are controlled by the same control signal transmitted from the controller 121. However, the present disclosure is not limited thereto. The microwave oscillators 655-1 and 655-2 may be configured to be individually controlled by individual control signals transmitted from the controller 121 to the microwave oscillators 655-1 and 655-2, respectively.

(Cooling Chamber)

Figure 4:
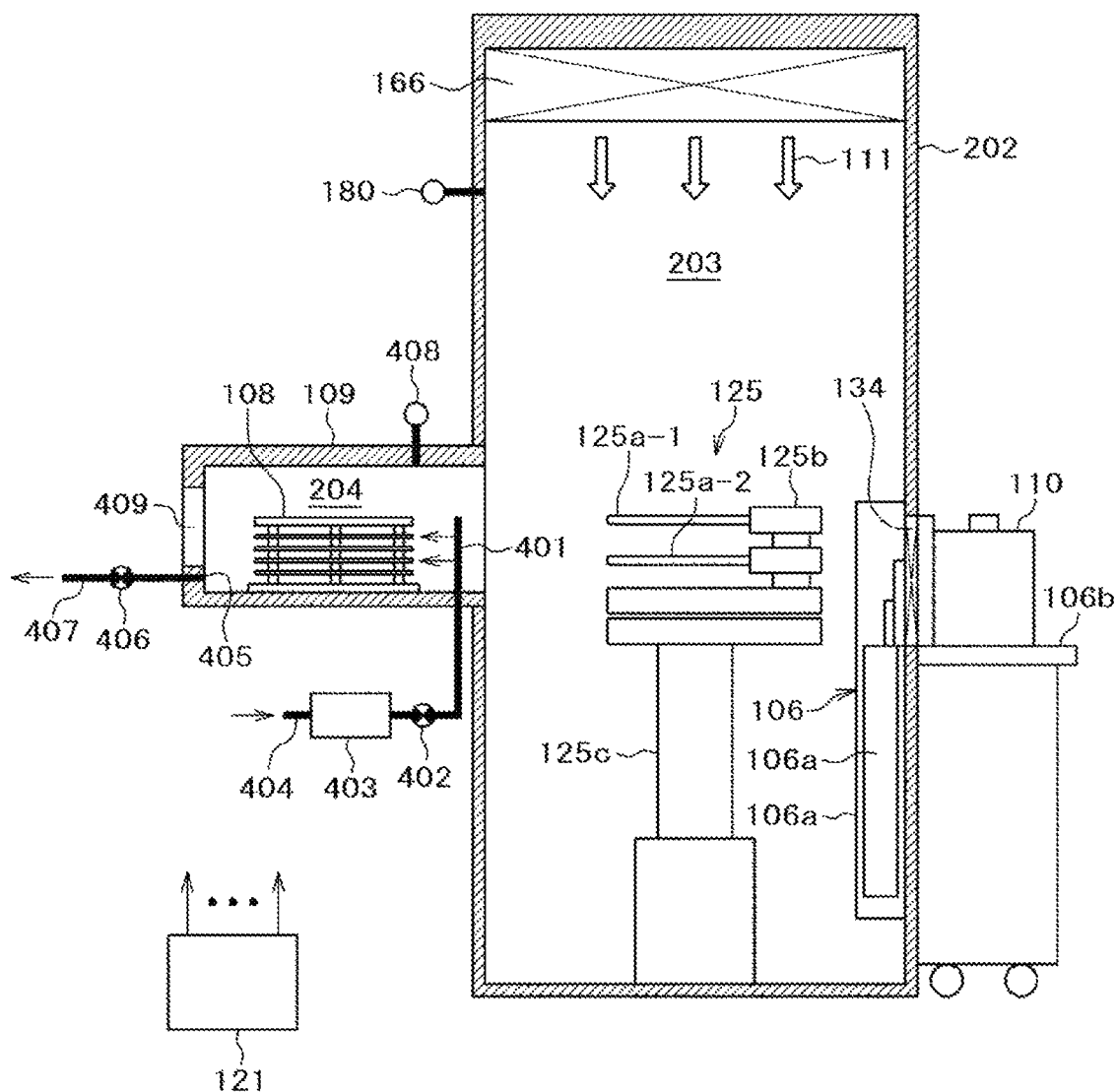
FIG. 4 is a vertical cross-sectional view in which a schematic configuration of a substrate processing apparatus suitably used in some embodiments of the present disclosure is shown at a position of a cooling chamber.
Figure 5A:
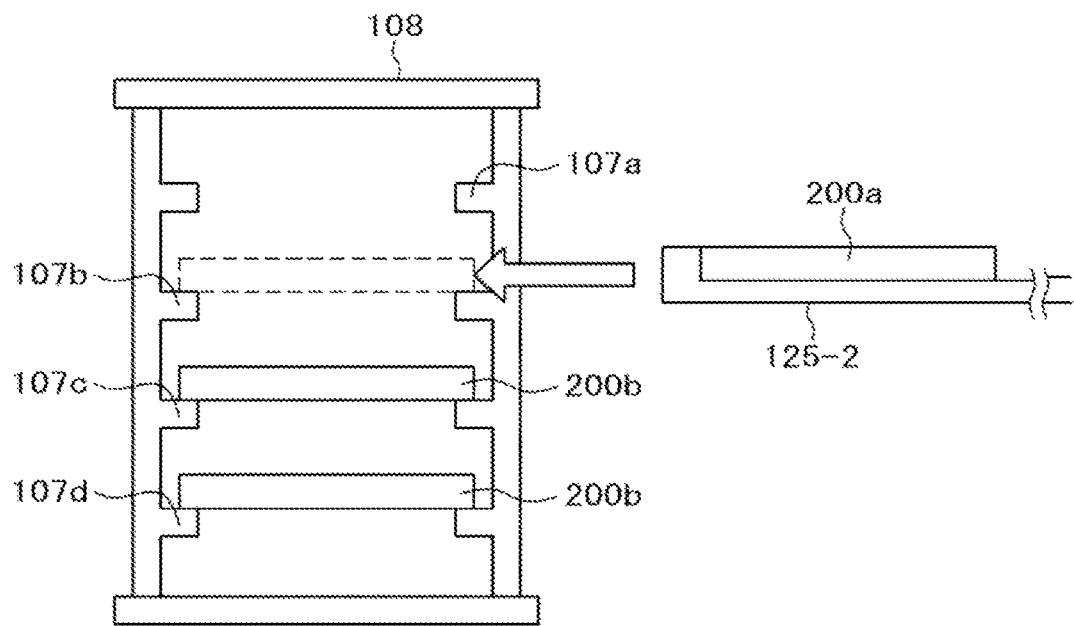
FIG. 5A is a diagram schematically showing a method of transferring a wafer to a cooling chamber.
Figure 5B:
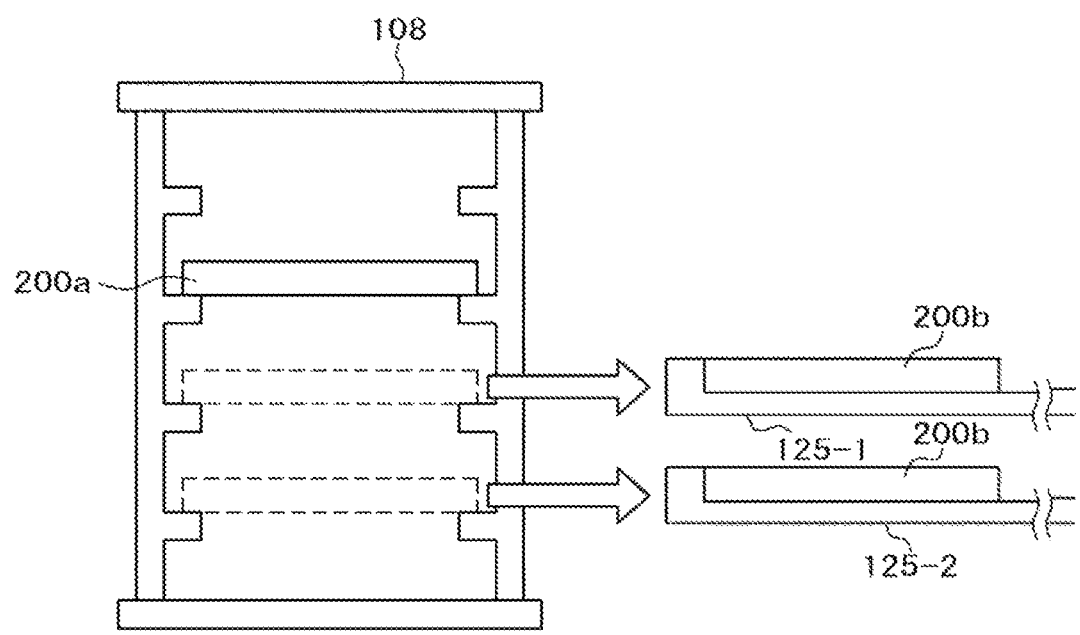
FIG. 5B is a diagram schematically showing a method of transferring the cooled wafer from the cooling chamber.

As shown in FIGS. 2 and 4, a cooling chamber (also referred to as a cooling area or a cooler) 204 as a cooling region for cooling the wafer 200 subjected to a predetermined substrate processing is formed by a cooling case 109 on a lateral side of the transfer chamber 203 at a position substantially equidistant from the process chambers 201-1 and 201-2 between the process chambers 201-1 and 201-2, specifically at a position substantially equidistant from the substrate loading/unloading ports 206 of the process chambers 201-1 and 201-2. Inside the cooling chamber 204, there is provided a wafer cooling mounting tool (also referred to as a cooling stage and hereinafter referred to as CS) 108 having a structure similar to that of the boat 217 as a substrate holder. As shown in FIGS. 5A and 5B described later, the CS 108 is configured to horizontally hold a plurality of wafers 200 in multiple stages in the vertical direction by a plurality of wafer holding grooves 107a to 107d. Further, in the cooling case 109, there is installed a gas supply nozzle (cooling chamber gas supply nozzle) 401 as a cooling chamber purge gas supplier that supplies an inert gas as a purge gas (cooling chamber purge gas) for purging an atmosphere in the cooling chamber 204 via a gas supply pipe (cooling chamber gas supply pipe) 404 at a predetermined first gas flow rate. The gas supply nozzle 401 may be an opening nozzle having an opened nozzle end. It is desirable to use a multi-hole nozzle with a plurality of gas supply holes installed on a side wall of the nozzle facing the CS 108. Further, a plurality of gas supply nozzles 401 may be installed. The purge gas supplied from the gas supply nozzle 401 may be used as a cooling gas for cooling the processed wafers 200 mounted on the CS 108.

As shown in FIG. 2, it is desirable that the cooling chamber 204 is installed between the process chamber 201-1 and the process chamber 201-2. As a result, the moving distance (moving time) between the process chamber 201-1 and the cooling chamber 204 and the moving distance between the process chamber 201-2 and the cooling chamber 204 can be made the same, and a takt time can be made the same. Further, by installing the cooling chamber 204 between the process chamber 201-1 and the process chamber 201-2, it is possible to improve the transfer throughput.

As shown in FIGS. 5A and 5B, the CS 108 installed inside the cooling chamber 204 is capable of holding four wafers 200. That is, the CS 108 is configured to be capable of cooling the wafers 200 (four wafers) at least twice the number of wafers 200 (2 wafers) heated in the process chamber 201-1 or 201-2.

Further, in the cooling chamber 204, there are installed an exhaust port 405 for exhausting the cooling chamber purge gas, an opening/closing valve (or APC valve) 406 as a cooling chamber exhaust valve for adjusting an gas exhaust amount, and an exhaust pipe 407 as a cooling chamber exhaust pipe. In the exhaust pipe 407 at the rear stage of the opening/closing valve 406, there may be installed a cooling chamber vacuum pump (not shown) for positively exhausting an atmosphere in the cooling chamber 204. The exhaust pipe 407 may be connected to a purge gas circulation structure for circulating an atmosphere in the transfer chamber 203 which will be described later.

Further, a cooling chamber pressure sensor (cooling chamber pressure gauge) 408 for detecting a pressure in the cooling chamber 204 is installed in the cooling case 109. In order to keep a difference between a pressure in the transfer chamber detected by a transfer chamber pressure sensor (transfer chamber pressure gauge) 180 and a pressure in the cooling chamber 204 constant, the controller 121 described later controls the MFC 403 as a cooling chamber MFC and the valve 402 as a cooling chamber valve to perform supply or supply stop of the purge gas, and controls the opening/closing valve 406 and the cooling chamber vacuum pump to perform exhaust and exhaust stop of the purge gas. By these controls, the pressure in the cooling chamber 204 and the temperature of the wafers 200 mounted on the CS 108 are controlled. A cooling chamber gas supply system (first gas supplier) is mainly composed of the gas supply nozzle 401, the valve 402, the MFC 403, and the gas supply pipe 404. A cooling chamber gas exhaust system (cooling chamber gas exhauster) is mainly composed of the exhaust port 405, the opening/closing valve 406 and the exhaust pipe 407. The cooling chamber vacuum pump may be included in cooling chamber gas exhaust system. Further, a temperature sensor (not shown) for measuring the temperature of the wafers 200 mounted on the CS 108 may be installed in the cooling chamber 204. In this specification, each of the wafer holding grooves 107a to 107d is simply described as a wafer holding groove 107 unless there is a need to distinguish them from each other.

(Drive Mechanism)

Figure 9:
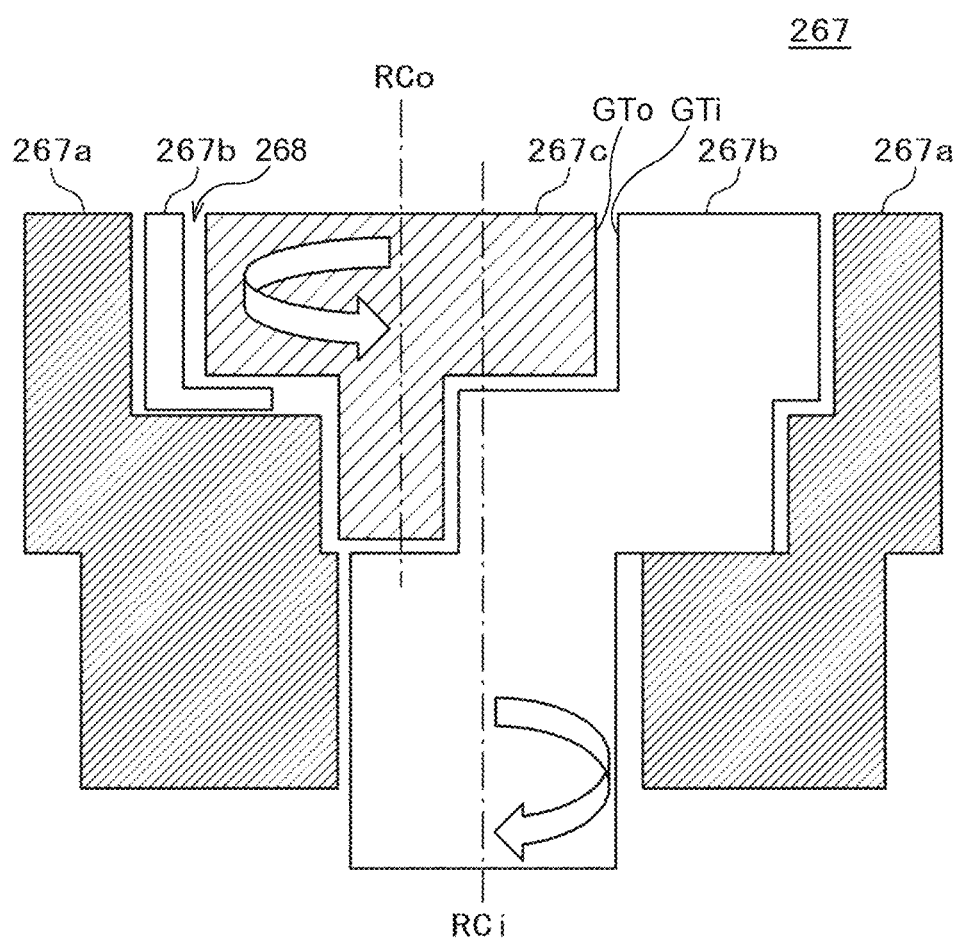
FIG. 9 is a schematic configuration diagram in which a drive mechanism of a substrate processing apparatus suitably used in some embodiments of the present disclosure is shown in a vertical cross-sectional view.
Figure 10:
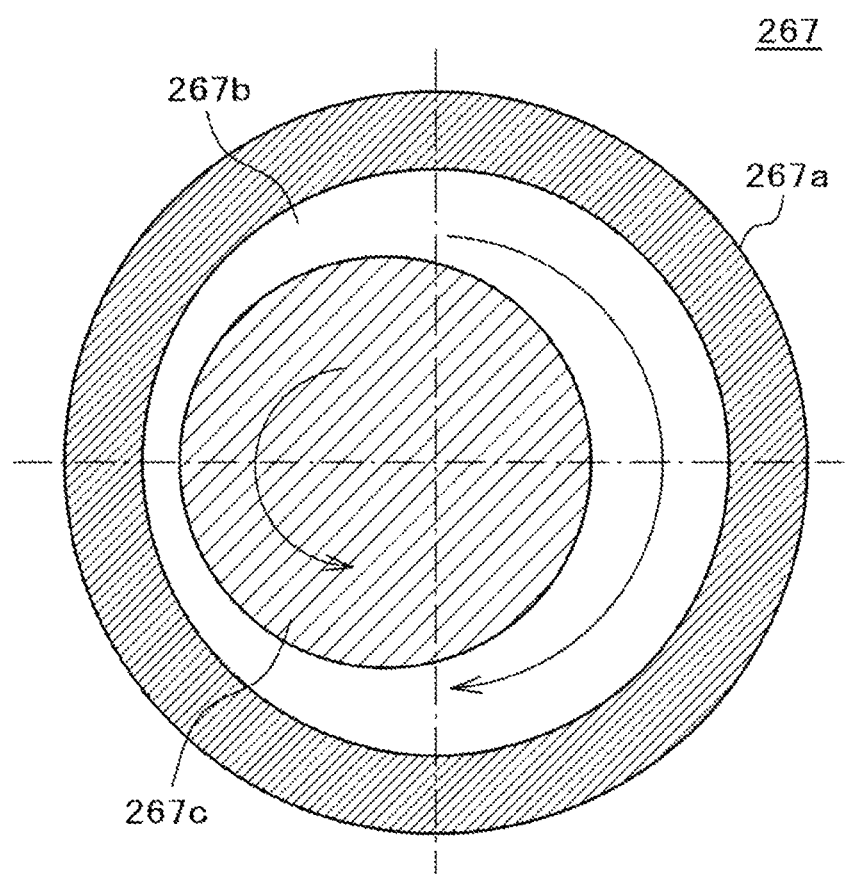
FIG. 10 is a schematic configuration diagram in which a drive mechanism of a substrate processing apparatus suitably used in some embodiments of the present disclosure is shown in a top view.

The configuration and operation of the drive mechanism 267 will be described with reference to FIGS. 8 to 12. As shown in FIGS. 9 and 10, the drive mechanism 267 includes an engaging portion 267a fixed to a bottom of the case 102, an input shaft 267b rotated by a driver (not shown), and an output shaft 267c having a rotation center RCo that is off-centered from a rotation center RCi of the input shaft 267b. A concave portion 268 is formed in an upper portion of the input shaft 267b, and gear teeth GTi are formed on an inner circumference of the concave portion 268. The output shaft 267c has gear teeth GTo on an outer circumference thereof. The teeth GTi of the concave portion 268 of the input shaft 267b and the teeth GTo of the output shaft 267c are fitted with each other and are configured to rotate in opposite directions to each other.

Figure 8:
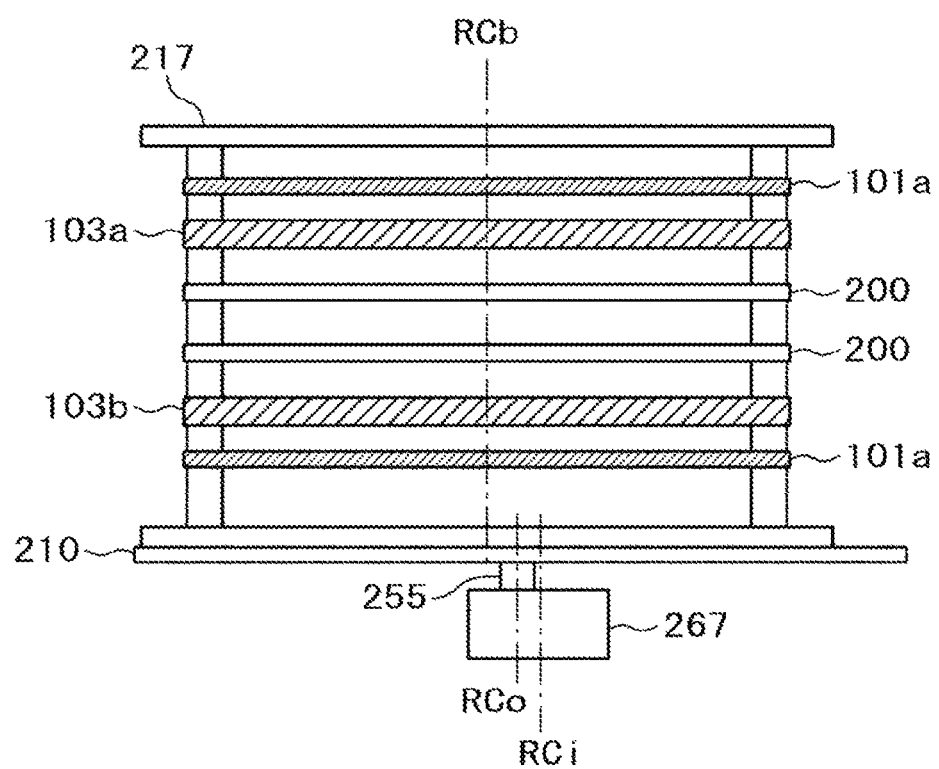
FIG. 8 is a schematic configuration diagram in which a boat, a mounting table and a drive mechanism of a substrate processing apparatus suitably used in some embodiments of the present disclosure are shown in a vertical cross-sectional view.

As shown in FIG. 8, a mounting table 210 is installed on the output shaft 267c via a shaft 255 such that a rotation center RCo of the output shaft 267c and a rotation center of the mounting table 210 coincide with each other. The rotation center RCb of the boat 217 (wafer 200) may coincide with or may be off-centered from the rotation center RCo of the output shaft 267c. The boat 217, the output shaft 267c, and the input shaft 267b constitute a substrate holder.

By setting the rotation center RCo of the output shaft 267c to be off-centered with respect to the rotation center RCi of the input shaft 267b, the output shaft 267c moves along an orbit revolving around the rotation center RCi of the input shaft 267b. Further, the rotation number of the output shaft 267c for one rotation of the input shaft 267b can be determined by a gear ratio between the input shaft 267b and the output shaft 267c. As a result, the rotation center of the input shaft 167b is deviated from the rotation center of the mounting table 210 installed on the output shaft 267c via the shaft 255. Therefore, eccentric rotation is generated, and a relationship of rotation and revolution is established. It is desirable that the rotation number of the output shaft 267c, which is the rotation number of the wafer 200, is an integral multiple of the rotation number of the input shaft 267b. By adopting the integral multiple, for example, when the processing is completed, the wafer 200 is returned to an original position (substrate transfer position). This makes it easy to load and unload the wafer 200.

Figure 11:
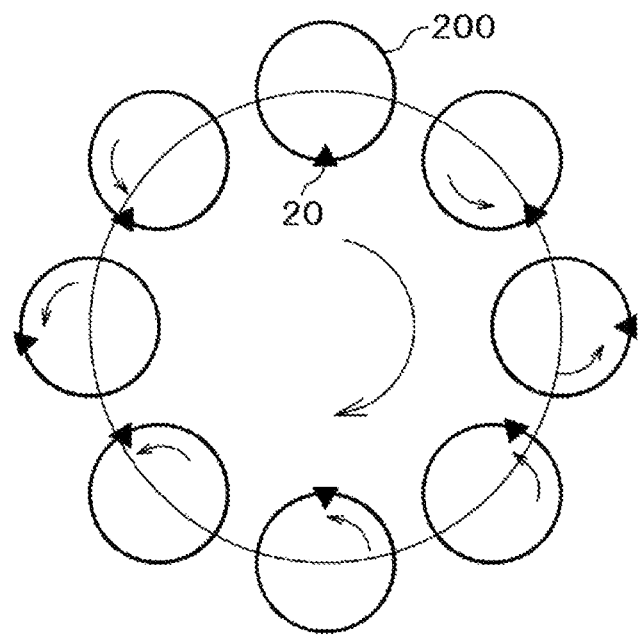
FIG. 11 is a diagram illustrating rotation and revolution of wafers performed by a drive mechanism of a substrate processing apparatus suitably used in some embodiments of the present disclosure and is a view showing a case where centers of rotation of the wafers and an axis of an output portion of the drive mechanism are not eccentric.

For example, when a ratio of the rotation number of the input shaft 267b to the rotation number of the output shaft 267c is 1:2, the wafer 200 moves along an orbit shown in FIG. 11. In this case, the rotation center RCo of the output shaft 267c and the rotation center RCb of the wafer 200 coincide with each other. While the wafer 200 rotates in a clockwise direction by one rotation (revolution) in accordance with the rotation of the input shaft 267b, the wafer 200 itself rotates in a counterclockwise direction (rotation). In FIG. 11, a notch 20 is shown such that the rotation position of the wafer 200 becomes clear.

Figure 12:
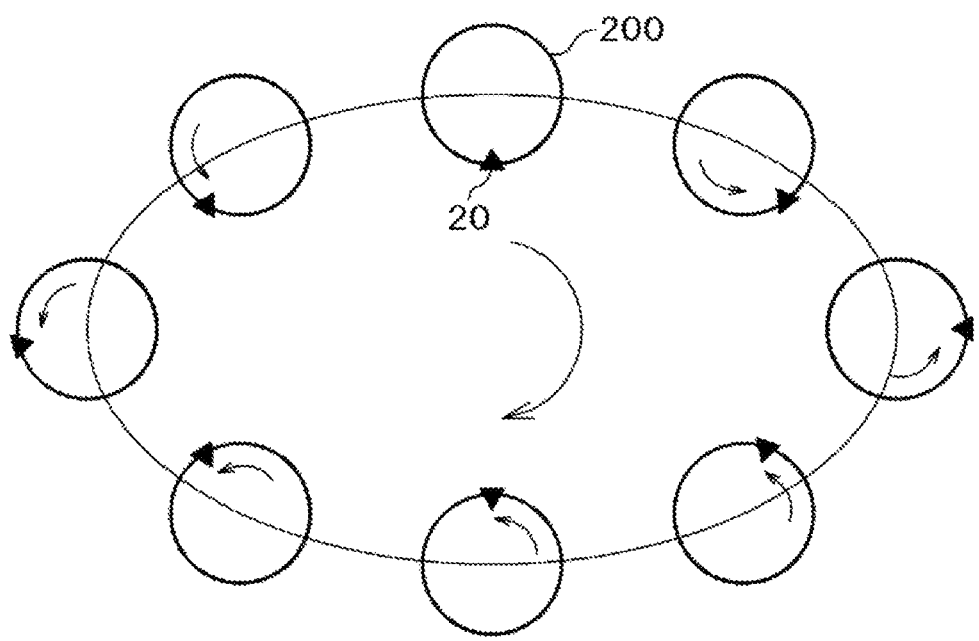
FIG. 12 is a diagram illustrating rotation and revolution of wafers performed by a drive mechanism of a substrate processing apparatus suitably used in some embodiments of the present disclosure and is a view showing a case where centers of rotation of the wafers and an axis of an output portion of the drive mechanism are eccentric.

Further, when a ratio of the rotation number of the input shaft 267b to the rotation number of the output shaft 267c is 1:2 and the rotation center RCo of the output shaft 267c and the rotation center RCb of the wafer 200 are deviated from each other, the wafer 200 moves along an orbit shown in FIG. 12. The spin (rotation) of the wafer 200 itself does not change, but an orbit of spin (revolution) draws an elliptical orbit.

By changing a gear ratio (rotation number) between the input shaft 267b and the output shaft 267c of the drive mechanism 267 as described above, a fixed point of the wafer 200 disappears. This makes it possible to suppress a phenomenon that thick portions and thin portions appear in a circumferential direction by an influence of a standing wave due to wavelength and frequency of an electromagnetic wave in induction heating of irradiating an electromagnetic wave to the wafer 200. Accordingly, non-uniformity of the film thickness is improved.

(Control Device)

Figure 6:
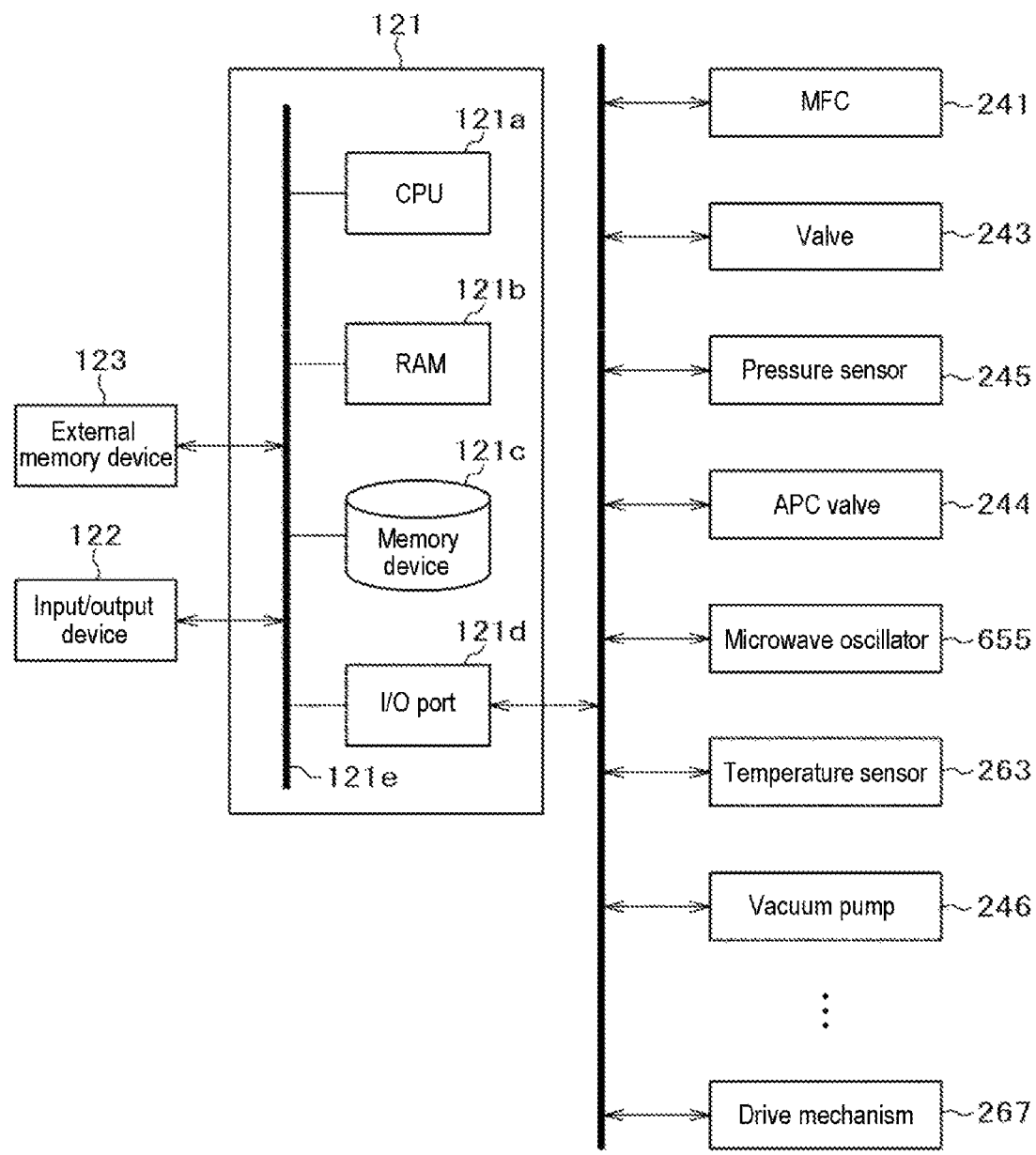
FIG. 6 is a schematic configuration diagram of a controller of a substrate processing apparatus suitably used in some embodiments of the present disclosure.

As shown in FIG. 6, the controller 121, which is a control part (control device or control means), is configured as a computer that includes a CPU (Central Processing Unit) 121a, a RAM (Random Access Memory) 121b, a memory device 121c, and an I/O port 121d. The RAM 121b, the memory device 121c and the I/O port 121d are configured to exchange data with the CPU 121a via an internal bus 121e. An input/output device 122 configured as, for example, a touch panel or the like is connected to the controller 121.

The memory device 121c is composed of, for example, a flash memory, an HDD (Hard Disk Drive), or the like. The memory device 121c readably stores a control program that controls an operation of a substrate processing apparatus, a process recipe that describes the procedure and conditions of an annealing (modifying) process, and the like. The process recipe is a combination that can allow the controller 121 to execute each procedure in a below-described substrate processing process to obtain a predetermined result. The process recipe functions as a program. Hereinafter, the process recipe, the control program, and the like are collectively and simply referred to as a program. In addition, the process recipe is also simply referred to as a recipe. When the term "program" is used herein, it may include only a recipe, only a control program, or both. The RAM 121b is configured as a memory area (work area) in which programs, data, and the like read by the CPU 121a are temporarily held.

The I/O port 121d is connected to the transfer machine 125, the MFC 241, the valve 243, the pressure sensor 245, the APC valve 244, the vacuum pump 246, the temperature sensor 263, the drive mechanism 267, the microwave oscillator 655, and the like.

The CPU 121a is configured to read the control program from the memory device 121c and execute the same. The CPU 121a is also configured to read the process recipe from the memory device 121c in response to an input of an operation command from the input/output device 122. The CPU 121a is configured to control, according to the contents of the process recipe thus read, a transfer operation of the substrate performed by the transfer machine, a flow rate adjustment operation of various gases performed by the MFC 241, the opening/closing operation of the valve 243, a pressure regulation operation performed by the APC valve 244 based on the pressure sensor 245, start and stop of the vacuum pump 246, an output adjustment operation of the microwave oscillator 655 based on the temperature sensor 263, rotation, rotation speed adjustment or elevation operations of the mounting table 210 (or the boat 217) performed by the drive mechanism 267, and the like.

The controller 121 may be configured by installing, in a computer, the above-described program stored in an external memory device (e.g., a magnetic disk such as a hard disk or the like, an optical disk such as a CD or the like, a magneto-optical disk such as an MO or the like, or a semiconductor memory such as a USB memory or the like) 123. The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. The provision of the program to the computer may be performed by using a communication means such as the Internet or a dedicated line without using the external memory device 123.

(2) Substrate Processing Process

Figure 7:
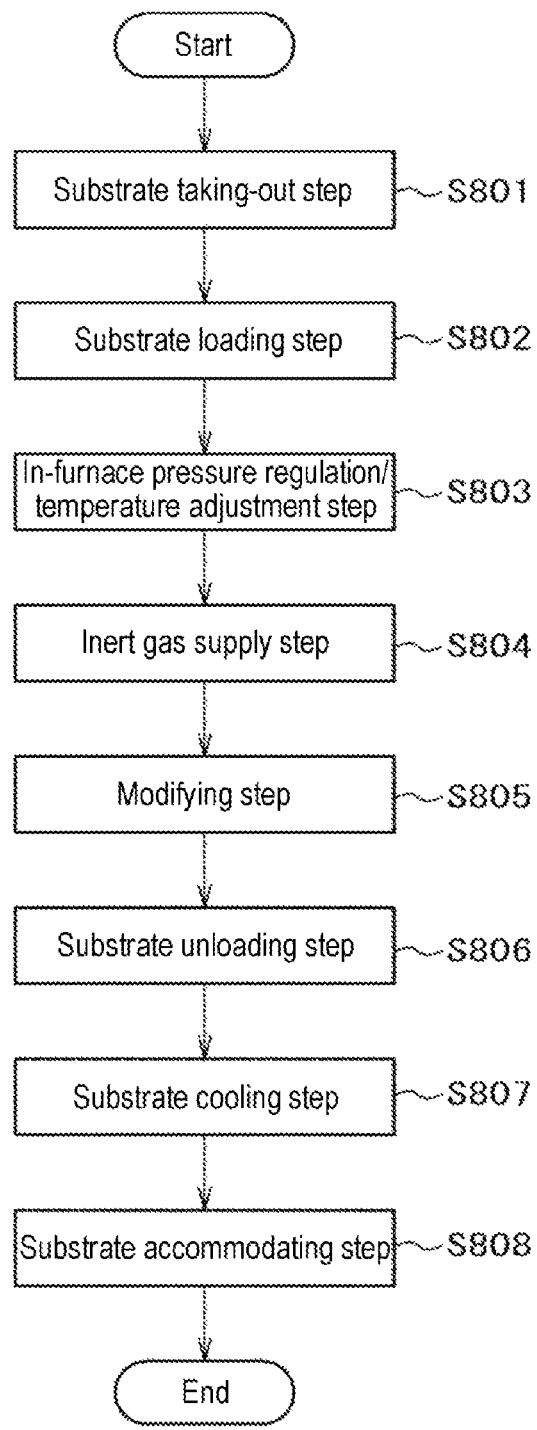
FIG. 7 is a diagram showing a flow of a substrate processing process according to some embodiments of the present disclosure.

Next, as one process of manufacturing a semiconductor device using the process furnace of the above-described substrate processing apparatus 100, for example, an example of a method of modifying (crystallizing) an amorphous silicon film as a silicon-containing film formed on a substrate will be described with reference to a process flow shown in FIG. 7. In the following description, operations of respective parts constituting the substrate processing apparatus 100 are controlled by the controller 121. In the substrate processing process according to the present embodiments, similar to the process furnace structure described above, the same processing contents or the same recipe is used in a plurality of processes. Therefore, the substrate processing process performed using one process furnace will be described, and the description of the substrate processing process performed using the other process furnace will be omitted.

When the term "wafer" is used herein, it may refer to "a wafer itself" or "a stacked body of a wafer and a predetermined layer or film formed on the surface of the wafer." Furthermore, when the phrase "a surface of a wafer" is used herein, it may refer to "a surface of a wafer itself" or "a surface of a predetermined layer or the like formed on a wafer." Moreover, the expression "a predetermined layer is formed on a wafer" as used herein may mean that "a predetermined layer is directly formed on a surface of a wafer itself" or that "a predetermined layer is formed on a layer or the like formed on a wafer." When the term "substrate" or "semiconductor substrate" is used herein, it may be synonymous with the term "wafer."

(Substrate Taking-out Step (S801))

As shown in FIG. 1, the transfer machine 125 takes out a predetermined number of wafers 200 to be processed from the pod 110 opened by the load port unit 106 and loads the wafers 200 on both the tweezers 125a-1 and 125a-2. That is, two wafers are placed on the tweezers 125a-1 for low temperature and the tweezers 125a-2 for high temperature, and the two wafers are taken out from the pod 110.

(Substrate Loading Step (S802))

As shown in FIGS. 1 and 3, the wafers 200 placed on the tweezers 125a-1 and 125a-2 are loaded into a predetermined process chamber 201 by opening and closing the gate valve 205 (boat loading). That is, the two wafers placed on the tweezers 125a-1 for low temperature and the tweezers 125a-2 for high temperature are loaded into the process chamber 201.

(In-Furnace Pressure Regulation/Temperature Adjustment Step (S803))

After the loading of the boat 217 into the process chamber 201 is completed, the atmosphere in the process chamber 201 is controlled such that the pressure in the process chamber 201 becomes a predetermined pressure (for example, 10 to 102,000 Pa). Specifically, while exhausting by the vacuum pump 246, a valve opening degree of the pressure regulator 244 is feedback-controlled based on pressure information detected by the pressure sensor 245 such that the pressure in the process chamber 201 is set to a predetermined pressure. At the same time, the electromagnetic wave supplier may be controlled to perform preheating and may be controlled to perform heating to a predetermined temperature (S803). When the temperature is raised to a predetermined substrate processing temperature by the electromagnetic wave supplier, it is desirable that the temperature raising is performed by an output smaller than an output of a below-described modifying step such that the wafer 200 is not deformed or broken. In the case where a substrate processing process is performed at an atmospheric pressure, after the in-furnace temperature is adjusted without regulating the in-furnace pressure, the process may be controlled so as to proceed to an inert gas supply step S804 to be described later.

(Inert Gas Supply Step (S804))

After the pressure and the temperature in the process chamber 201 are controlled to predetermined values in the in-furnace pressure regulation/temperature adjustment step S803, the drive mechanism 267 rotates the shaft 255 and rotates the wafer 200 via the boat 217 on the mounting table 210. At this time, an inert gas such as a nitrogen gas or the like is supplied through the gas supply pipe 232 (S804). Furthermore, at this time, the pressure in the process chamber 201 is regulated to a predetermined value falling within a range of 10 Pa to 102,000 Pa, for example, 101,300 Pa or more and 101,650 Pa or less. Further, the shaft 255 may be rotated during the substrate loading step S802, that is, after the wafer 200 has been completely loaded into the process chamber 201.

(Modifying Step (S805))

When the interior of the process chamber 201 is maintained at a predetermined pressure, the microwave oscillator 655 supplies a microwave into the process chamber 201 via the above-described respective parts. By supplying the microwave into the process chamber 201, the wafer 200 is heated to a temperature of 100 degrees C. or more and 1,000 degrees C. or less, specifically 400 degrees C. or more and 900 degrees C. or less, more specifically 500 degrees C. or more and 700 degrees C. or less. By performing the substrate processing process at such a temperature, the substrate is processed at a temperature at which the wafer 200 efficiently absorbs the microwave. This makes it possible to increase a speed of the modifying step. In other words, if the wafer 200 is processed at a temperature lower than 100 degrees C. or higher than 1,000 degrees C., the surface of the wafer 200 deteriorates and becomes difficult to absorb the microwave. Therefore, it becomes difficult to heat the wafer 200. Accordingly, it is desirable to perform the substrate processing process within the above-described temperature range.

For example, in the present embodiments in which heating is performed by an electromagnetic wave heating method, a standing wave is generated in the process chamber 201. On the wafer 200 (also, similar to the wafer 200, the susceptor 103 in the case where the susceptor 103 is loaded), there are generated a locally-heated concentrated heating region (hot spot) and a remaining unheated region (non-heating region). By controlling an on/off operation of the power supply of the electromagnetic wave supplier in order to suppress deformation of the wafer 200 (also, similar to the wafer 200, the susceptor 103 in the case where the susceptor 103 is loaded), it is possible to suppress generation of a hot spot on the wafer 200. At this time, it is possible to suppress deformation of the wafer 200 by controlling the supply power of the electromagnetic wave supplier to a low output and an influence of the hot spot to be decreased. However, in this case, since an energy radiated to the wafer 200 or the susceptor 103 becomes small, the heating temperature also becomes small, and thus it is needed to lengthen the heating time.

As described above, the temperature sensor 263 is a non-contact-type temperature sensor. If deformation, position shift or breakage occurs in the wafer 200 as a measurement target (also the susceptor 103, similar to the wafer 200), the position of the wafer 200 monitored by the temperature sensor 263 and the measurement angle with respect to the wafer 200 are changed. Therefore, the measurement value (monitoring value) may become inaccurate and the measurement temperature may be changed rapidly. In the present embodiments, a rapid change in the measurement temperature of the radiation thermometer due to such deformation or breakage of the measurement target is used as a trigger for turning on and off the electromagnetic wave supplier.

By controlling the microwave oscillator 655 as described above, the wafer 200 is heated, and the amorphous silicon film formed on the surface of the wafer 200 is modified (crystallized) into a polysilicon film (S805). That is, it becomes possible to uniformly modify the wafer 200. In the case where the measured temperature of the wafer 200 becomes high or low beyond the above-mentioned threshold value, the output of the microwave oscillator 655 may be lowered without turning off the microwave oscillator 655, whereby the temperature of the wafer 200 may be set to fall within a predetermined range. In this case, when the temperature of the wafer 200 returns to the temperature falling within the predetermined range, the output of the microwave oscillator 655 is controlled to become high.

When a preset processing time has elapsed, the rotation of the boat 217, the supply of the gas, the supply of the microwave and the exhaust through the exhaust pipe are stopped.

(Substrate Unloading Step (S806))

After the pressure in the process chamber 201 is returned to the atmospheric pressure, the gate valve 205 is opened to allow the process chamber 201 and the transfer chamber 203 to spatially communicate with each other. Thereafter, one heated (processed) wafer 200 mounted on the boat 217 is unloaded to the transfer chamber 203 by the tweezers 125*a*-2 for high temperature of the transfer machine 125 (S806).

(Substrate Cooling Step (S807))

The one heated (processed) wafer 200 unloaded by the tweezers 125*a*-2 for high temperature is moved to the cooling chamber 204 by a continuous operation of the transfer device 125*b* and the transfer device elevator 125*c* and is mounted on the CS 108 by the tweezers 125*a*-2 for high temperature. Specifically, as shown in FIG. 5A, the wafer 200*a* subjected to the modifying step S805 and held by the tweezers 125*a*-2 for high temperature is transferred to the wafer holding groove 107*b* formed in the CS 108, and is held for a predetermined time, so that the wafer 200*a* is cooled (S807). At this time, when the cooled wafer 200*b* which has already been cooled in the CS 108 is mounted as shown in FIG. 5B, the tweezers 125*a*-2 for high temperature after mounting the wafer 200*a* subjected to the modifying step S805 on the wafer holding groove 107*b*, and the tweezers 125*a*-1 for low temperature transfer the two cooled wafers 200*b* to the load port, that is, the pod 110.

When two wafers 200 are collectively heated (processed) on the boat 217 in the process chamber 201, the substrate unloading step (S806) and the substrate cooling step (S807) are continuously performed a plurality of times (twice in this example). Thus, two high-temperature wafers 200*a* are mounted on the CS 108 one by one by the tweezers 125*a*-2 for high temperature. At this time, when two cooled wafers 200*b* are mounted on the CS 108, the two cooled wafers 200*b* are unloaded from the CS 108 to the pod 110 by the tweezers 125*a*-2 for high temperature and the tweezers 125*a*-1 for low temperature. As a result, it is possible to shorten a time for the tweezers 125*a*-2 for high temperature to hold the high-temperature wafer 200*a*, which makes it possible to reduce a heat load of the transfer machine 125. In addition, it is possible to prolong a time for cooling the wafer 200.

As described above, the tweezers 125a-2 for high temperature is installed, and the high-temperature wafer 200a heated (processed) in the process chamber 201 is moved to the CS 108 in the cooling chamber 204 by the tweezers 125a-2 for high temperature while keeping the wafer 200a at a relatively high temperature without cooling the wafer 200a to, for example, 100 degrees C. or less in the process chamber 201.

(Substrate Accommodating Step (S808))

Two wafers 200 cooled in the substrate cooling step S807 are taken out from the cooling chamber 204 by the tweezers 125a-1 for low temperature and the tweezers 125a-2 for high temperature and are transferred to a predetermined pod 110. By combining the single-wafer transfer (loading into the cooling chamber 204) and the two-wafer transfer (transfer from the cooling chamber 204) in this way, it is possible to speed up the transfer of the wafer 200.

By performing the above operation one or more times, the wafer 200 is modified and moved to the next substrate processing process. Although there has been described the configuration in which the substrate processing process is performed by mounting two wafers 200 on the boat 217, the present disclosure is not limited thereto. The wafers 200 may be mounted, one by one, on the boats 217 installed in the process chambers 201-1 and 201-2 and may be subjected to the same process. By performing a swap process, two wafers 200 may be processed in the process chambers 201-1 and 201-2. At this time, the transfer destination of the wafer 200 may be controlled such that the numbers of times of the substrate processing process performed in the respective process chambers 201-1 and 201-2 are matched with each other. By performing such control, the numbers of times of the substrate processing process performed in the respective process chambers 201-1 and 201-2 become constant, which makes it possible to efficiently perform a work such as maintenance or the like. For example, when the process chamber to which the wafer 200 has been previously transferred is the process chamber 201-1, control is performed such that the destination of the next wafer 200 becomes the process chamber 201-2, which makes it possible to control the numbers of times of the substrate processing process executed in the respective process chambers 201-1 and 201-2.

According to the present embodiments, one or more of the following effects may be obtained.

(a) In the microwave annealing, an electric field distribution is generated by a standing wave. During the rotation of the substrate with the center position thereof fixed, the electric field distribution causes heating unevenness due to a hot spot. Therefore, by changing the rotation center of the substrate, it is possible to reduce uneven heating.

(b) By installing the center of the input shaft of the rotator at a position deviated from the center of the substrate, it is possible to reduce heating unevenness.

(c) The rotation number of the substrate is an integral multiple of the rotation number of the input shaft of the rotator. As a result, when the processing is completed after a predetermined time has elapsed, it is possible to return the substrate to the same position (substrate loading position) as at the start of rotation. This makes it easy to load the substrate into the substrate holder or unload the substrate from the substrate holder.

(d) The input shaft and output shaft of the rotator have gears, respectively, and the number of gear teeth on the input shaft is integral multiple of the number of gear teeth on the output shaft. As a result, when the processing is completed after a predetermined time has elapsed, it is possible to return the substrate to the same position (substrate loading position) as at the start of rotation. This makes it easy to load the substrate into the substrate holding part or unload the substrate from the substrate holding part.

The configuration of the above-described embodiments may be appropriately modified, and the effects thereof may also be obtained. For example, in the above description, there has been described the process of modifying an amorphous silicon film as a film containing silicon as a main component into a polysilicon. However, the present disclosure is not limited thereto. The film formed on the surface of the wafer 200 may be modified by supplying a gas containing at least one selected from the group of oxygen (O), nitrogen (N), carbon C), and hydrogen (H). For example, in the case where a hafnium oxide film ($Hf_xO_y$ film) as a high dielectric film is formed on the wafer 200, a microwave may be supplied to heat the hafnium oxide film while supplying a gas containing oxygen. This makes it possible to supplement a lost oxygen in the hafnium oxide film and to improve characteristics of the high dielectric film.

Although the hafnium oxide film is shown herein, the present disclosure is not limited thereto. The present disclosure may be suitably applied to a case of modifying an oxide film containing at least one metal element of aluminum (Al), titanium (Ti), zirconium (Zr), tantalum (Ta), niobium (Nb), lanthanum (La), cerium (Ce), yttrium (Y), barium (Ba), strontium (Sr), calcium (Ca), lead (Pb), molybdenum (Mo), tungsten (W) and the like, i.e., a metal-based oxide film. That is, the aforementioned film-forming sequence may be suitably applied to a case of modifying a TiOCN film, a TiOC film, a TiON film, a TiO film, a ZrOCN film, a ZrOC film, a ZrON film, a ZrO film, a HfOCN film, a HfOC film, a HfON film, a HfO film, a TaOCN film, a TaOC film, a TaON film, a TaO film, a NbOCN film, a NbOC film, a NbON film, a NbO film, an AlOCN film, an AlOC film, an AlON film, an AlO film, a MoOCN film, a MoOC film, a MoON film, a MoO film, a WOCN film, a WOC film, a WON film or a WO film, which is formed on the wafer 200.

In addition to the high dielectric film, a film doped with impurities and containing silicon as a main component may be heated. Examples of the film containing silicon as a main component include Si-based oxide films such as a silicon nitride film (SiN film), a silicon oxide film (SiO film), a silicon oxycarbide film (SiOC film), a silicon oxycarbonitride film (SiOCN film), a silicon oxynitride film (SiON film), and the like. Examples of the impurities include at least one selected from the group of boron (B), carbon (C), nitrogen (N), aluminum (Al), phosphorus (P), gallium (Ga), arsenic (As), and the like.

Furthermore, the film may be a resist film based on at least one selected from the group of a polymethyl methacrylate (PMMA) resin, an epoxy resin, a novolac resin, a polyvinyl phenyl resin, and the like.

Although one process of manufacturing a semiconductor device has been described above, the present disclosure is not limited thereto but may be applied to a substrate processing technique such as a patterning process of a liquid crystal panel manufacturing process, a patterning process of a solar cell manufacturing process, a patterning process of a power device manufacturing process, or the like.

The present disclosure is not limited to the above-described embodiments and includes various modifications. For example, the above embodiments have been described in detail for a better understanding of the present disclosure and is not needed to be limited to the one including all the configurations described above.

Further, there has been described an example of creating a program that realizes a part or all of the above-mentioned configurations, functions, control devices and the like. Needless to say, all or part of them may be realized as hardware by, for example, them in an integrated circuit. That is, all or part of the functions of the processing part may be realized by, for example, an integrated circuit such as an ASIC (Application Specific Integrated Circuit) or an FPGA (Field Programmable Gate Array) instead of the program.

According to the present disclosure in some embodiments, it is possible to improve the film thickness uniformity.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
   a process chamber configured to process at least one substrate;
   a microwave generator configured to generate a microwave;
   a substrate holder configured to load and hold the at least one substrate; and
   a rotator which includes an output shaft configured to support the substrate holder and an input shaft installed at an off-centered position with respect to the output shaft,
   wherein a concave portion is formed in an upper portion of the input shaft and first gear teeth are formed on an inner circumference of the concave portion,
   wherein second gear teeth are formed on an outer circumference of the output shaft, and
   wherein the first gear teeth of the concave portion of the input shaft are fitted with the second gear teeth of the output shaft.

2. The substrate processing apparatus of claim 1, wherein the output shaft is off-centered with respect to a center of the at least one substrate.

3. The substrate processing apparatus of claim 1, wherein the input shaft and the output shaft are fitted to each other, and the input shaft and the output shaft are configured to rotate in opposite directions.

4. The substrate processing apparatus of claim 1, wherein a rotation number of the input shaft and a rotation number of the output shaft are different from each other.

5. The substrate processing apparatus of claim 1, wherein a rotation number of the output shaft is an integral multiple of a rotation number of the input shaft.

6. The substrate processing apparatus of claim 1, wherein a rotation number of the at least one substrate is an integral multiple of a rotation number of the input shaft.

7. A substrate holding apparatus, comprising:
   a substrate holder configured to load and hold at least one substrate;
   an output shaft configured to support the substrate holder; and
   an input shaft installed at an off-centered position with respect to the output shaft,
   wherein a concave portion is formed in an upper portion of the input shaft and first gear teeth are formed on an inner circumference of the concave portion,
   wherein second gear teeth are formed on an outer circumference of the output shaft, and
   wherein the first gear teeth of the concave portion of the input shaft are fitted with the second gear teeth of the output shaft.

8. The substrate holding apparatus of claim 7, wherein the output shaft is off-centered with respect to a center of the at least one substrate.

9. The substrate holding apparatus of claim 7, wherein the input shaft and the output shaft are fitted to each other, and the input shaft and the output shaft are configured to rotate in opposite directions.

10. The substrate holding apparatus of claim 7, wherein a rotation number of the input shaft and a rotation number of the output shaft are different from each other.

11. The substrate holding apparatus of claim 7, wherein a rotation number of the output shaft is an integral multiple of a rotation number of the input shaft.

12. The substrate holding apparatus of claim 7, wherein a rotation number of the at least one substrate is an integral multiple of a rotation number of the input shaft.

13. A method of manufacturing a semiconductor device, comprising:
    loading at least one substrate into a substrate processing apparatus that includes a process chamber configured to process the at least one substrate, a microwave generator configured to generate a microwave, a substrate holder configured to load and hold the at least one substrate, and a rotator which includes an output shaft configured to support the substrate holder and an input shaft installed at an off-centered position with respect to the output shaft; and
    heating the at least one substrate with the microwave,
    wherein a concave portion is formed in an upper portion of the input shaft and first gear teeth are formed on an inner circumference of the concave portion,
    wherein second gear teeth are formed on an outer circumference of the output shaft, and
    wherein the first gear teeth of the concave portion of the input shaft are fitted with the second gear teeth of the output shaft.

* * * * *